(12) United States Patent
Wada et al.

(10) Patent No.: US 8,368,064 B2
(45) Date of Patent: Feb. 5, 2013

(54) GLASS FOR SCATTERING LAYER OF ORGANIC LED DEVICE AND ORGANIC LED DEVICE

(75) Inventors: Naoya Wada, Tokyo (JP); Nobuhiro Nakamura, Tokyo (JP); Nao Ishibashi, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 13/137,160

(22) Filed: Jul. 25, 2011

(65) Prior Publication Data

US 2011/0278622 A1    Nov. 17, 2011

Related U.S. Application Data

(63) Continuation of application No. PCT/JP2010/050727, filed on Jan. 21, 2010.

(30) Foreign Application Priority Data

Jan. 26, 2009    (JP) ................................ P2009-014332

(51) Int. Cl.
| | |
|---|---|
| *H01L 29/08* | (2006.01) |
| *H01L 35/24* | (2006.01) |
| *H01L 51/00* | (2006.01) |
| *H01L 23/58* | (2006.01) |
| *H01L 23/29* | (2006.01) |

(52) U.S. Cl. .......... 257/40; 257/633; 257/634; 257/641; 257/644; 257/650; 257/794; 257/E51.001

(58) Field of Classification Search .............. 257/40, 257/633, 634, 641, 644, 650, 794, E51.001
See application file for complete search history.

(56) References Cited

U.S. PATENT DOCUMENTS

| | | | | |
|---|---|---|---|---|
| 5,246,890 A | * | 9/1993 | Aitken et al. | .................... 501/15 |
| 7,161,292 B2 | * | 1/2007 | Leo | ............................... 313/504 |
| 7,638,448 B2 | * | 12/2009 | Wolff et al. | ..................... 501/45 |
| 7,994,082 B2 | | 8/2011 | Zou et al. | |
| 8,018,140 B2 | | 9/2011 | Nakamura et al. | |
| 8,236,598 B2 | * | 8/2012 | Khadilkar et al. | .............. 438/72 |
| 2005/0007000 A1 | | 1/2005 | Chou et al. | |
| 2006/0128549 A1 | * | 6/2006 | Hormadaly | ...................... 501/45 |

(Continued)

FOREIGN PATENT DOCUMENTS

| | | |
|---|---|---|
| JP | 2004-513483 A | 4/2004 |
| JP | 2005-154253 A | 6/2005 |

(Continued)

OTHER PUBLICATIONS

International Search Report in PCT/JP2010/050727.

(Continued)

*Primary Examiner* — Ida M Soward
(74) *Attorney, Agent, or Firm* — Foley & Lardner LLP

(57) ABSTRACT

A glass to be used in a scattering layer of an organic LED element, and an organic LED element using the scattering layer are provided. The organic LED element of the present invention includes, a transparent substrate, a first electrode provided on the transparent electrode, an organic layer provided on the first electrode, and a second electrode provided on the organic layer, and further includes a scattering layer including, in terms of mol % on the basis of oxides, 15 to 30% of $P_2O_5$, 5 to 25% of $Bi_2O_3$, 5 to 27% of $Nb_2O_5$, and 10 to 35% of ZnO and having a total content of alkali metal oxides including $Li_2O$, $Na_2O$ and $K_2O$ of 5% by mass or less.

10 Claims, 8 Drawing Sheets

U.S. PATENT DOCUMENTS

2007/0042891 A1* 2/2007 Ritter et al. ............... 501/46
2007/0249483 A1* 10/2007 Ritter et al. ............... 501/135
2009/0153972 A1* 6/2009 Nakamura et al. ........... 359/599
2011/0284907 A1* 11/2011 Nakamura et al. ........... 257/98

FOREIGN PATENT DOCUMENTS

WO  WO 02/37568 A1   5/2002
WO  WO 2009/017035 A1  2/2009

OTHER PUBLICATIONS

English translations of International Preliminary Report on Patentability and Written Opinion in PCT/JP2010/050727.

* cited by examiner

GLASS FOR SCATTERING LAYER OF ORGANIC LED DEVICE AND ORGANIC LED DEVICE

TECHNICAL FIELD

The present invention relates to a glass, particularly a glass to be used in a scattering layer of an organic LED element, and an organic LED element using the glass.

BACKGROUND ART

An organic LED element has an organic layer. The organic LED element includes a bottom emission type which extracts light emitted by the organic layer from a transparent substrate.

The current situation of the organic LED element is that the amount of the light which can be extracted to the outside the organic LED element is less than 20% of the emitted light.

There is a document which describes that a light scattering layer comprising a glass is provided in the organic LED element to improve the light-extraction efficiency (Patent Document 1).

In recent years, environmental pollution becomes a serious problem in the melting of a glass containing lead oxide. Therefore, the glass is required to be free from lead oxide.

BACKGROUND ART DOCUMENT

Patent Documents

Patent Document 1: JP-T-2004-513483

SUMMARY OF THE INVENTION

Problems that the Invention is to Solve

However, Patent Document 1 does not disclose and suggest the content of a composition of the glass, and therefore has the problem that the invention cannot be practiced.

Means for Solving the Problems

A glass for a scattering layer of an organic LED element, which is one embodiment of the present invention comprises, in terms of mol % on the basis of oxides, 15 to 30% of $P_2O_5$, 5 to 25% of $Bi_2O_3$, 5 to 27% of $Nb_2O_5$, and 10 to 35% of ZnO, and has the total content of alkali metal oxides comprising $Li_2O$, $Na_2O$ and $K_2O$ of 5% by mass or less.

An organic LED element which is one embodiment of the present invention comprises a transparent substrate, a first electrode provided on the transparent electrode, an organic layer provided on the first electrode, and a second electrode provided on the organic layer, and further comprises a scattering layer comprising, in terms of mol % on the basis of oxides, 15 to 30% of $P_2O_5$, 5 to 25% of $Bi_2O_3$, 5 to 27% of $Nb_2O_5$, and 10 to 35% of ZnO, and having the total content of alkali metal oxides comprising $Li_2O$, $Na_2O$ and $K_2O$ of 5% by mass or less.

Advantage of the Invention

According to the present invention, a glass for a scattering layer to be used in an organic LED element and an organic LED element using the scattering layer can be provided.

MODE FOR CARRYING OUT THE INVENTION

Figure 1:
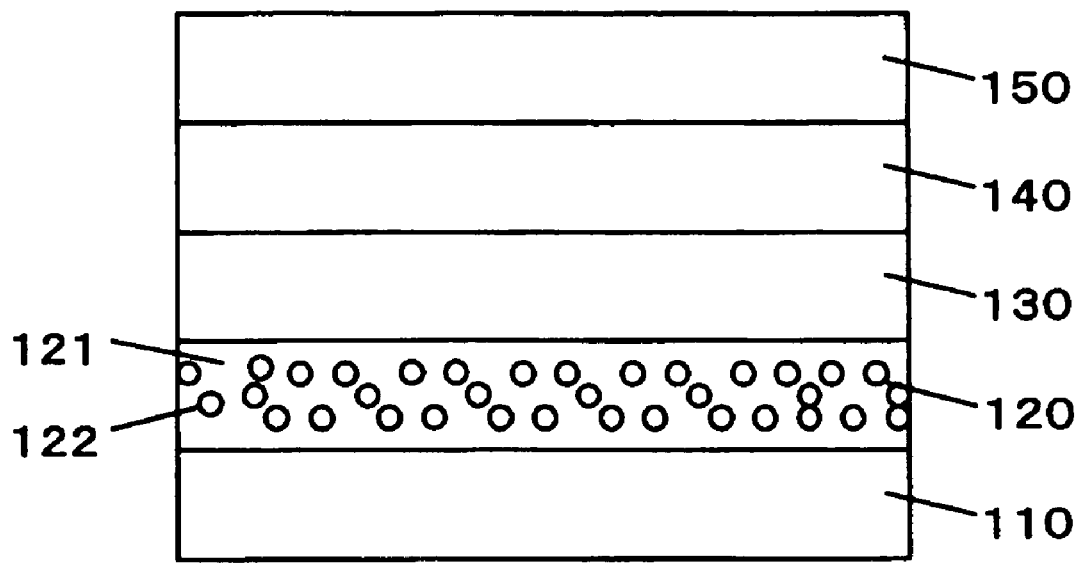
FIG. 1 is a cross-sectional view of a first organic LED element of the present invention.

An embodiment of the present invention is described in detail below by reference to the accompanying drawings. In the drawings, the corresponding parts are shown by the corresponding reference numerals. The following embodiment is shown as one example, and the invention can be practiced with various modifications without departing the spirit and scope of the present invention.

(Organic LED Element)

First, the organic LED element of the present invention is described using the drawings.

FIG. 1 is a cross-sectional view of a first organic LED element of the present invention. The first organic LED element of the present invention is a bottom-emission type organic LED element. The first organic LED element of the present invention has a transparent substrate 110, a scattering layer 120 formed on the transparent 110, a first electrode 130 formed on the scattering layer 120, an organic layer 140 formed on the first electrode 130, and a second electrode 150 formed on the organic layer 140. In the first organic LED element of the present invention, the first electrode 130 is a transparent electrode (anode), and the second electrode 150 is a reflective electrode (cathode). The first electrode 130 has transparency for transmitting light emitted from the organic layer 140 to the scattering layer 120. On the other hand, the second electrode 150 has reflectivity for reflecting the light emitted from the organic layer 140 and returning the light to the organic layer 140.

Figure 2:
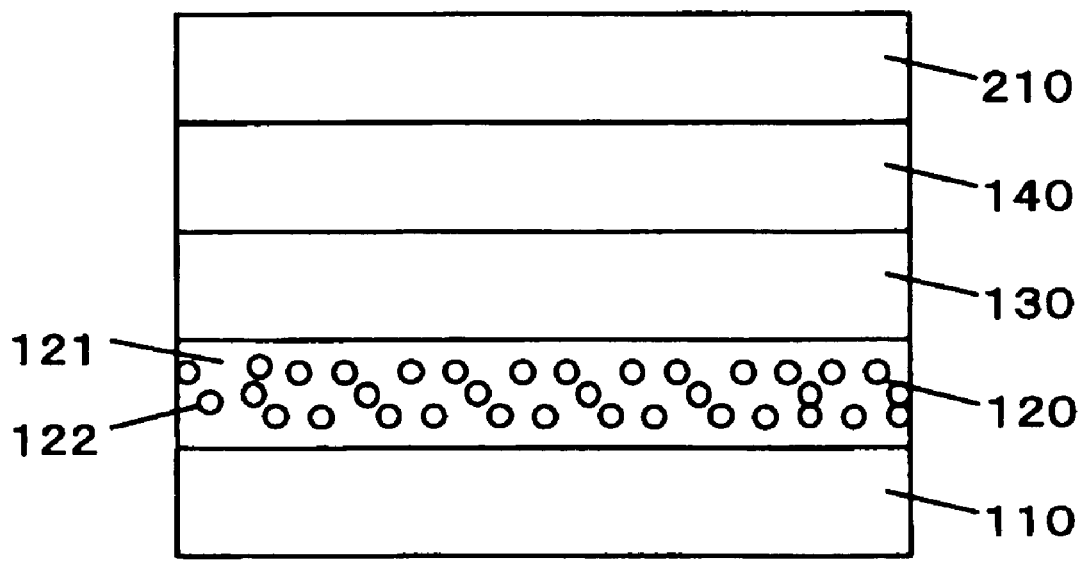
FIG. 2 is a cross-sectional view of a second organic LED element of the present invention.

FIG. 2 is a cross-sectional view of a second organic LED element of the present invention. The second organic LED element of the present invention is both surface-emission type organic LED element. The second organic LED element of the present invention has a transparent substrate 110, a scattering layer 120 formed on the transparent substrate 110, a first electrode 130 formed on the scattering layer 120, an organic layer 140 formed on the first electrode 130, and a second electrode 210 formed on the organic layer 140. In the second organic LED element of the present invention, the first electrode 130 is a transparent electrode (anode), and the second electrode 210 is a transparent electrode (cathode). The first electrode 130 has transparency for transmitting light emitted from the organic layer 140 to the transparent substrate 110. On the other hand, the second electrode 210 has transparency for transmitting light emitted from the organic layer 140 to the surface opposite the surface facing the organic layer 140. The organic LED element is used in illumination applications in which light is emitted from both sides.

Each constitution of the first organic LED element is described in detail below as the representative. In the first and second LED elements, it is needless to say that the parts having the same reference numerals have the same constitution or the same function.

(Transparent Substrate)

A material having high transmittance to visible light, such as a glass substrate, is mainly used as a translucent substrate used in the formation of the transparent substrate 110. Specifically, other than the glass substrate, a plastic substrate is used as the material having high transmittance. Materials of the glass substrate include inorganic glasses such as alkali glass, alkali-free glass or quartz glass. A silica film or the like may be applied to the surface of the glass substrate in order to prevent diffusion of glass components. Materials of the plastic substrate include polyester, polycarbonate, polyether, polysulfone, polyether sulfone, polyvinyl alcohol, and fluorine-containing polymers such as polyvinylidene fluoride and polyvinyl fluoride. The plastic substrate may have barrier properties in order to prevent that water penetrates the substrate. Thickness of the transparent substrate is preferably 0.1 mm to 2.0 mm in the case of a glass. However, too small thickness decreases strength. Therefore, the thickness is particularly preferably 0.5 mm to 1.0 mm.

(Scattering Layer)

The scattering layer 120 is formed by forming a glass powder on a substrate by a method such as coating, and firing the glass powder at the desired temperature, and has a base material 121 having a first refractive index, and a plurality of scattering materials 122 having a second refractive index different from the refractive index of the base material 121, dispersed in the base material 121. A plurality of the scattering materials 122 has the constitution that the distribution of the scattering materials in the scattering layer is decreased toward the outermost surface from the inside of the scattering layer. By constituting the scattering layer with a glass, smoothness of the surface can be maintained while maintaining excellent scattering characteristics, and by using at the light outgoing surface side of an light emission device or the like, light extraction having extremely high efficiency can be achieved.

A glass having high light transmittance (base material) is used as the scattering layer. A plurality of scattering materials (for example, bubbles, precipitated crystals, particles of materials different from the base material, and phase-separated glasses) are formed inside the base material. The term "particles" used herein means small solid materials, and includes fillers and ceramics. The bubbles mean air or gases. The phase-separated glass means a glass constituted of two kinds or more of glass phases.

In order to improve the light extraction efficiency, the refractive index of the base material is preferably equivalent to or higher than the refractive index of the first electrode. In the case where the refractive index is low, loss by total reflection is generated at the interface between the base material and the first electrode. It is sufficient that the refractive index of the base material exceeds that of the first electrode in a part (for example, red, blue or green) in emission spectrum range of at least the organic layer. The refractive index of the base material exceeds over preferably the entire area of the emission spectrum range (430 nm to 650 nm), and more preferably the entire area of the wavelength range (360 nm to 830 nm) of visible light. When the difference between the refractive index of the base material and the refractive index of the first electrode is within 0.2, the refractive index of the first electrode may be higher than the refractive index of the base material.

In order to prevent short-circuit between electrodes of the organic LED element, it is necessary that the main surface of the scattering layer is smooth. For this reason, it is not preferred that the scattering materials project from the main surface of the scattering layer. In order that the scattering materials do not project from the main surface of the scattering layer, it is preferred that the scattering materials are not present within 0.2 μm from the main surface of the scattering layer. Arithmetic average roughness (Ra) defined by JIS B-0601-1994 of the main surface of the scattering layer is preferably 30 nm or less, more preferably 10 nm or less (see Table 1), and particularly preferably 1 nm or less. The refractive indexes of the scattering material and the base material each may be high, but it is preferred that the difference (Δn) in refractive indexes is 0.2 or more in at least one part in the emission spectrum range of the light-emitting layer. To obtain sufficient scattering characteristics, the difference (Δn) in refractive indexes is more preferably 0.2 or more over the entire area of the emission spectrum range (430 nm to 650 nm) or the entire area of wavelength range (360 nm to 830 nm) of visible light.

In order to obtain the maximum refractive index difference, it is desired that the base material is constituted of a high refractive index glass and the scattering material is constituted of a gaseous substance, that is, bubbles.

Color of light emission can be changed by allowing the base material to have a specific transmittance spectrum. Colorant can use the conventional materials such as transition metal oxides, rare earth metal oxides and metal colloids, and can use those alone or as mixtures of those.

It is generally necessary in backlight and illumination applications to emit in white color. The known whitening is a method of spatially color-coding red, blue and green (coding method), a method of laminating a light-emitting layer having different luminescent color (lamination method), and a method of spatially separating light emitted in blue and converting color with a color conversion material provided (color conversion method). It is sufficient in backlight and illumination applications only if while color is uniformly obtained. For this reason, the lamination method is generally used. The light-emitting layer laminated uses the combination that while is obtained by additive mixture. For example, there are the case of laminating a blue-green layer and an orange layer, and the case of laminating red, blue and green. Particularly, in illumination applications, color reproducibility on the irradiated surface is important, and it is desired to have light-emitting spectrum necessary to a visible light region. In the case of laminating the blue-green layer and the orange layer, emission intensity of green color is low. Therefore, when an object containing green in large proportion is lighted, color reproducibility is deteriorated. The lamination method has the merit that it is not necessary to spatially change color arrangement, whereas has the following two problems. The first problem is that because the film thickness of the organic layer is small, the emitted light extracted receives the influence of interference. As a result, color changes depending on the viewing angle. In the case of while color, because human eyes have high sensitivity to color shade, the phenomenon gives rise to the problem. The second problem is that carrier balance deviates during light-emitting, luminance changes in each color, and color shade changes.

The organic LED element of the present invention can use a fluorescent material as the scattering material or the base material. This can bring about the effect that wavelength conversion can be made by light emission from the organic layer, thereby changing the color. In this case, it is possible to decrease the emitted light color of the organic LED, and because the emitted light is scattered and outgoes, angular dependency of color and time change of color can be suppressed.

(First Electrode)

The first electrode (anode) is required to have translucency of 80% or more in order to extract light generated in the organic layer 140 to the outside. Furthermore, in order to inject many holes, the first electrode having high work function is required. Specifically, materials such as ITO (Indium Tin Oxide), $SnO_2$, ZnO, IZO (Indium Zinc Oxide), AZO ($ZnO—Al_2O_3$: zinc oxide doped with aluminum), GZO ($ZnO—Ga_2O_3$: zinc oxide doped with gallium), Nb-doped $TiO_2$, and Ta-doped $TiO_2$ are used. Thickness of the anode is preferably 100 nm or more. Refractive index of the anode 130 is 1.9 to 2.2. When carrier concentration is increased, the refractive index of ITO can be decreased. The commercially available ITO has the standard that $SnO_2$ is 10 wt %. In view of this, by increasing Sn concentration, the refractive index of ITO can be decreased. Carrier concentration is increased by increasing Sn concentration, but mobility and transmittance are decreased. Therefore, it is necessary to determine Sn amount by balancing those.

The first electrode used in the bottom-emission type organic LED element is mainly described above, but it is needless to say that the first electrode may be used in a both surface-emission type organic LED element.

(Organic Layer)

The organic layer 140 is a layer having a light-emitting function, and is constituted of a hole-injection layer, a hole-transport layer, a light-emitting layer, an electron-transport layer, and an electron-injection layer. Refractive index of the organic layer 140 is 1.7 to 1.8.

The hole-injection layer is required to have small difference in ionization potential in order to lower hole-injection barrier from the anode. Improvement in injection efficiency of charges from electrode interface in the hole-injection layer decreases driving voltage of the element, and additionally increases injection efficiency of charges. In high molecular materials, polyethylene dioxythiophene doped with polystyrene sulfonic acid (PSS) (PEDOT:PSS) is widely used, and in low molecular materials, phthalocyanine type copper phthalocyanine (CuPc) is widely used.

The hole-transport layer acts to transport holes injected from the hole-injection layer to the light-emitting layer. It is necessary to have appropriate ionization potential and hole mobility. The hole-transport layer specifically uses triphenylamine derivatives, N,N'-bis(1-naphthyl)-N,N'-diphenyl-1,1'-biphenyl-4,4'-diamine (NPD), N,N'-diphenyl-N,N'-bis[N-phenyl-N-(2-naphthyl)-4'-aminobiphenyl-4-yl]-1,1'-biphenyl-4,4'-diamine (NPTE), 1,1-bis[(di-4-triamino)-phenyl]cyclohexane (HTM2) and N,N'-diphenyl-N,N'-bis(3-methylphenyl)-1,1'-diphenyl-4,4'-diamine (TPD). Thickness of the hole-transport layer is preferably 10 nm to 150 nm. Voltage can be decreased as decreasing the thickness. However, the thickness is particularly preferably 10 nm to 150 nm from the problem of short-circuit between electrodes.

The light-emitting layer provides the field to recouple the injected electrons and holes, and uses a material having high light-emitting efficiency. Describing in detail, a light-emitting host material used in the light-emitting layer and a doping material of a light-emitting dye function as a recoupling center of holes and electrons, injected from the anode and the cathode. The doping of the light-emitting dye to the host material in the light-emitting layer obtains high light-emitting efficiency, and additionally converts light-emitting wavelength. Those are required to have appropriate energy level for charge injection, and to form a homogeneous amorphous thin film having excellent chemical stability and heat resistance.

It is further required to be excellent in kinds of light-emitting color and color purity, and to be high in light-emitting efficiency. The light-emitting material as the organic material includes low molecular type materials and high molecular type materials. Furthermore, the light-emitting materials are classified into fluorescent materials and phosphorescent materials, depending on light-emitting mechanism. The light-emitting layer specifically includes metal complexes of quinoline derivatives, such as tris(8-quinolinolato)aluminum complexes ($Alq_3$), bis(8-hydroxy)chinaldine aluminum phenoxide ($Alq'_2OPh$), bis(8-hydroxy)chinaldine aluminum-2,5-dimethylphenoxide (BAlq), mono(2,2,6,6-tetramethyl-3,5-heptanedionato)lithium complex (Liq), mono(8-quinolinolato)sodium complex (Naq), mono(2,2,6,6-tetramethyl-3,5-heptanedionato)lithium complex, mono(2,2,6,6-tetramethyl-3,5-heptanedionato)sodium complex, and bis(8-quinolinolato)calcium complex ($Caq_2$); tetraphenylbutadiene, phenylquinacridone (QD), anthracene, perylene, and fluorescent materials such as coronene. As the host material, quinolinolate complexes are preferred, and 8-quinolinol and aluminum complexes having its derivative as a ligand are particularly preferred.

The electron-transport layer acts to transport electrons injected from the electrode. Specifically, quinolinol aluminum complexes ($Alq_3$), oxadiazole derivatives (such as 2,5-bis(1-naphthyl)-1,3,4-oxadiazole (BND) and 2-(4-t-butylphenyl)-5-(4-biphenyl)-1,3,4-oxadiazole (PBD)), triazole derivatives, bathophenanthroline derivatives, silole derivatives and the like are used as the electron-transport layer.

The election-injection layer is required to increase injection efficiency of electrons. Specifically, a layer obtained by doping a cathode interface with an alkali metal such as lithium (Li) or cesium (Cs) is provided.

(Second Electrode)

Metal having small work function or its alloy is used as a reflective electrode (cathode) as the second electrode. The cathode specifically includes alkali metals, alkaline earth metals and group 3 metals of the periodic table. Of those, aluminum (Al), magnesium (Mg), silver (Ag) or alloys thereof are preferably used from that those are inexpensive and are materials having good chemical stability. Further, a co-vapor-deposited film of Al and MgAg, a laminated electrode in which Al is vapor-deposited on a thin vapor-deposited film of LiF or $Li_2O$, or the like may be used. Further, in a polymer system, a laminate of calcium (Ca) or barium (Ba) and aluminum (Al), or the like may be used.

In the case that the second electrode is used in a second organic LED element of a both surface-emission type, the second electrode is required to have translucency, not reflectivity. For this reason, the constitution and characteristics are preferred to be the same as in the first electrode.

(Glass for Scattering Layer)

Glass for a scattering layer in the organic LED element of the present invention is described in detail below.

Refractive index of the glass for a scattering layer is preferably equivalent to or higher than the refractive index of the translucent electrode material as described before, and is therefore desired to be high as possible. Glass transition temperature of the glass for a scattering layer is desired to be low as possible in order to prevent thermal deformation of a substrate in forming a scattering layer by firing and softening a glass powder. Coefficient of thermal expansion of the glass for a scattering layer is necessary to be close to or slighter lower than the thermal expansion coefficient of the substrate in order to prevent the phenomenon that strain is generated between a scattering layer and a substrate when forming the scattering layer and the scattering layer breaks or warps. In general, the thermal expansion coefficient of a glass having high refractive index and low transition temperature is considerably larger than the thermal expansion coefficient of the substrate. Therefore, the thermal expansion coefficient of the glass for a scattering layer is desired to be low as possible. Warpage and breakage are great barriers in forming the translucent electrode layer on the scattering layer.

The glass of the present invention comprises, in terms of mol % on the basis of oxides, 15 to 30% of $P_2O_5$, 5 to 25% of $Bi_2O_3$, 5 to 27% of $Nb_2O_5$, and 10 to 35% of ZnO, and has the total content of alkali metal oxides comprising $Li_2O$, $Na_2O$ and $K_2O$ of 5% by mass or less.

$P_2O_5$ is a component to form a network structure becoming the skeleton of a glass and stabilize the glass, and is essential. In the case where $P_2O_5$ is less than 15 mol %, the glass is easy to devitrificate. $P_2O_5$ is preferably 19 mol % or more, and more preferably 20 mol % or more. On the other hand, in the case where it exceeds 30 mol %, it is difficult to obtain high refractive index. $P_2O_5$ is preferably 28 mol % or less, and more preferably 26 mol % or less.

$Bi_2O_3$ is a component to impart high refractive index and improve stability of the glass, and is essential. In the case where $Bi_2O_3$ is less than 5%, the effect becomes insufficient. $Bi_2O_3$ is preferably 10 mol % or more, and more preferably 13 mol % or more. On the other hand, in case the where it exceeds 25 mol %, the thermal expansion coefficient is increased, and coloration is easy to be increased. $Bi_2O_3$ is preferably 23 mol % or less, and more preferably 20 mol % or less.

$Nb_2O_5$ is a component to impart high refractive index and decrease a coefficient of thermal expansion, and is essential. In the case where $Nb_2O_5$ is less than 5 mol % or less, its effect becomes insufficient. $Nb_2O_5$ is preferably 7 mol % or more, and more preferably 10 mol % or more. On the other hand, it exceeds 27 mol %, the glass transition temperature is increased, and the glass is easy to devitrificate. $Nb_2O_5$ is preferably 20 mol % or less, and more preferably 18 mol % or less.

ZnO is a component to greatly decrease the glass transition temperature while suppressing excess increase of the thermal expansion coefficient and increase the refractive index, and is essential. In the case where ZnO is less than 10 mol %, its effect becomes insufficient. ZnO is preferably 16 mol % or more, and more preferably 18 mol % or more. On the other hand, in the case where ZnO exceeds 35 mol % or more, devitrification tendency of a glass is increased. ZnO is preferably 30 mol % or less, and preferably 27 mol % or less. Although not always corresponding to mol % representation on one-on-one level, when expressed by % by mass, 7% by mass or more is preferred.

Alkali metal oxides comprising $Li_2O$, $Na_2O$ and $K_2O$ have a possibility to increase the thermal expansion coefficient. For this reason, it is preferred that the alkali metal oxides are not substantially contained (the content is nearly zero). However, the alkali metal oxides have the effects to impart devitrification resistance of a glass and decrease the glass transition temperature. Therefore, the alkali metal oxides may be contained in an amount up to 7 mol %.

The alkali metal moves when electric field is applied under humidity condition, and may have a possibility to destroy terminals of the organic LED element. For this reason, the total content of the alkali metal oxides is preferably 5% by mass or less, and more preferably 2% by mass or less, and it is particularly preferred that the alkali metal oxides are not substantially contained (the content is nearly zero).

$Na_2O$ and $K_2O$ particularly increase the thermal expansion coefficient as compared with $Li_2O$. Therefore, in the case of containing the alkali metal oxides, it is preferred that $Na_2O$ and $K_2O$ are not substantially contained (the contents are nearly zero), and only $Li_2O$ is used.

$TiO_2$ increases the glass transition temperature and makes easy to devitrificate the glass. For this reason, it is preferred that $TiO_2$ is not substantially contained (the content is nearly zero). However, $TiO_2$ has the effect to impart high refractive index. Therefore, $TiO_2$ may be contained up to 8 mol %.

$B_2O_3$ is not essential, but has the effect to improve meltability of the glass. For this reason, $B_2O_3$ may be contained up to 17 mol %. However, where $B_2O_3$ exceeds 17 mol %, devitrification and phase separation are easy to occur, and it is difficult to obtain high refractive index.

$WO_3$ is not essential, but has the effect to impart high refractive index without greatly changing the thermal expansion coefficient and the glass transition temperature. Therefore, $WO_3$ may be contained up to 20 mol %. However, where $WO_3$ exceeds 20 mol %, coloration is increased, and the glass is easy to devitrificate.

$TeO_2$ is not essential, but has the effect to decrease the glass transition temperature while suppressing excess increase in the thermal expansion coefficient. For this reason, $TeO_2$ may be contained up to 7 mol %. However, $TeO_2$ is expensive, and has a possibility to corrode a platinum crucible. Therefore, it is preferred that $TeO_2$ is not used in a large amount.

$GeO_2$ is not essential, but has the effect to impart high refractive index. For this reason, $GeO_2$ may be contained up to 7 mol %. However, $GeO_2$ is expensive. Therefore, it is preferred that $GeO_2$ is not used in a large amount.

$Sb_2O_3$ is not essential, but is effective as a clarifier and additionally has the effect to suppress coloration. For this reason, $Sb_2O_3$ may be contained up to 2 mol %.

Alkali earth metal oxides (MgO, CaO, SrO and BaO) are not essential, but have the effect to improve stability of the glass. For this reason, the alkali earth metal oxides may be contained up to 10 mol %. However, in the case where the alkali earth metal oxides are contained in an amount exceeding 10 mol %, the refractive index is decreased and the thermal expansion coefficient is increased.

The term "not substantially contained" means that the components are not positively contained, and includes the case that the components are incorporated as impurities derived from other components.

The glass of the present invention can contain $SiO_2$, $Al_2O_3$, $La_2O_3$, $Y_2O_3$, $Gd_2O_3$, $ZrO_2$, $Ta_2O_3$, $Cs_2O$, transition metal oxides and the like in amounts such that the effect of the invention is not impaired. The total content of those is preferably less than 5 mol %, and more preferably less than 3 mol %, and it is particularly preferred that those are not substantially contained (the content is nearly zero).

The glass of the present invention does not substantially contain lead oxide. Therefore, the possibility of causing environmental pollution is low.

The glass of the present invention can be obtained by using raw materials such as oxides, phosphates, methaphosphates, carbonates, nitrates and hydroxides, weighing those so as to obtain a desired composition, mixing those, melting the mixture at a temperature of 950 to 1,500° C. using a crucible such as platinum, casting the melt into a mold or pouring the melt between twin rolls, and rapidly cooling. Strain is sometimes removed by slow cooling. The glass prepared by the above method is used in the form of a powder. The glass powder is obtained by grinding the glass with a mortar, a ball mill, a jet mill or the like, followed by classification according to need. The mass average particle diameter of the glass powder is typically 0.5 to 10 microns. The surface of the glass powder may be modified with a surfactant or a silane coupling agent.

The glass frit is kneaded with a solvent, a binder or the like according to the necessity, applied to a transparent substrate, fired at a temperature about 60° C. higher than the glass transition temperature of the glass frit to soften the glass frit, and cooled to room temperature, thereby obtaining a scattering layer-attached transparent substrate. Examples of the solvent include α-terpineol, butyl carbitol acetate, phthalic acid ester, and 2,2,4-trimethyl-1,3-pentanediol monobutyrate, and examples of the binder include ethyl cellulose, acrylic resin, styrene resin, phenol resin and butyral resin. Components other than the solvent or the binder may be contained in a range that the objects of the present invention are not impaired. In the case of using the binder, it is preferred to include a step of firing at a temperature lower than the glass transition temperature to vaporize the binder, before softening the glass frit.

EXAMPLES

Composition of a glass by mol % representation in each example, and a refractive index ($n_d$), a glass transition temperature ($T_g$) and an average thermal expansion coefficient of from 50° C. to 300° C. ($\alpha_{50\text{-}300}$), each measured are shown in Tables 1 to 3. Furthermore, composition by mass % representation calculated based on the composition by mol % representation are shown. In each glass, oxides, methaphosphates or carbonates are used as raw materials of each component were used, after vitrification the raw materials were weight so as to become the composition shown in Table 1, sufficiently mixed, melted in a temperature range of 950° C. to 1,350° C. in an electric furnace using a platinum crucible, and cast into a carbon-made mold. The glass cast in the mold was cooled to the glass transition temperature, immediately placed in an annealing furnace and slowly cooled to room temperature, thereby obtaining each glass.

A refractive index ($n_d$), a glass transition temperature ($T_g$) and an average thermal expansion coefficient ($\alpha_{50\text{-}300}$) of from 50° C. to 300° C., of the glass obtained were measured as follows.

(1) Refractive Index ($n_d$)

After polishing a glass, the refractive index was measured with a precision refractometer KPR-2000 manufactured by Kalnew by a V-block method.

(2) Glass Transition Temperature ($T_g$)

After processing a glass into a rod having a diameter of 5 mm and a length of 200 mm, the refractive index of the rod was measured with a thermomechanical analyzer (TMA) TD5000SA manufactured by Bruker AXS in a temperature rising rate of 5° C./min.

(3) Thermal Expansion Coefficient from 50° C. to 300° C. ($\alpha_{50\text{-}300}$)

After processing a glass into a rod having a diameter of 5 mm and a length of 200 mm, the thermal expansion coefficient ($\alpha_{50\text{-}300}$) of the rod was measured with a thermomechanical analyzer (TMA) TD5000SA manufactured by Bruker AXS in a temperature rising rate of 5° C./min. When the length of the glass rod at 50° C. is $L_{50}$ and the length of the glass rod at 300° C. is $L_{300}$, the thermal expansion coefficient from 50° C. to 300° C. ($\alpha_{50\text{-}300}$) is obtained by $\alpha_{50\text{-}300} = \{(L_{300}/L_{50})-1\}/(300-50)$.

Examples 1 to 22 are Working Examples.

TABLE 1

| | Example | | | | | | |
|---|---|---|---|---|---|---|---|
| | 1 mol % | 2 mol % | 3 mol % | 4 mol % | 5 mol % | 6 mol % | 7 mol % |
| $P_2O_5$ | 20.0 | 19.7 | 21.7 | 22.1 | 19.7 | 15.9 | 25.1 |
| $Bi_2O_3$ | 17.3 | 14.2 | 15.6 | 13.9 | 12.9 | 20.9 | 16.4 |
| $Nb_2O_5$ | 13.9 | 15.0 | 16.5 | 14.8 | 13.7 | 12.0 | 17.3 |
| ZnO | 18.1 | 19.7 | 21.6 | 24.3 | 31.1 | 20.4 | 22.7 |
| $B_2O_3$ | 10.4 | 10.3 | 11.2 | 11.5 | 10.2 | 8.9 | 13.0 |
| $Li_2O$ | 5.2 | 4.8 | 3.7 | 4.7 | 4.3 | 5.0 | 5.5 |
| $Na_2O$ | 0.0 | 0.0 | 0.0 | 0.0 | 0.0 | 0.0 | 0.0 |
| $K_2O$ | 0.0 | 0.0 | 0.0 | 0.0 | 0.0 | 0.0 | 0.0 |
| $TiO_2$ | 6.9 | 7.4 | 0.0 | 0.0 | 0.0 | 7.7 | 0.0 |
| $WO_3$ | 8.2 | 8.9 | 9.7 | 8.7 | 8.1 | 9.2 | 0.0 |
| Other component | — | — | — | — | — | — | — |
| Total | 100.0 | 100.0 | 100.0 | 100.0 | 100.0 | 100.0 | 100.0 |
| | mass % | mass % | mass % | mass % | mass % | mass % | mass % |
| $P_2O_5$ | 14.6 | 15.1 | 15.7 | 17.0 | 15.8 | 11.1 | 19.0 |
| $Bi_2O_3$ | 41.6 | 35.7 | 37.0 | 35.0 | 34.0 | 47.8 | 40.8 |
| $Nb_2O_5$ | 19.1 | 21.5 | 22.3 | 21.3 | 20.6 | 15.7 | 24.6 |
| ZnO | 7.6 | 8.7 | 9.0 | 10.7 | 14.3 | 8.2 | 9.9 |
| $B_2O_3$ | 3.7 | 3.9 | 4.0 | 4.3 | 4.0 | 3.0 | 4.8 |
| $Li_2O$ | 0.8 | 0.8 | 0.6 | 0.8 | 0.7 | 0.7 | 0.9 |
| $Na_2O$ | 0.0 | 0.0 | 0.0 | 0.0 | 0.0 | 0.0 | 0.0 |
| $K_2O$ | 0.0 | 0.0 | 0.0 | 0.0 | 0.0 | 0.0 | 0.0 |
| $TiO_2$ | 2.8 | 3.2 | 0.0 | 0.0 | 0.0 | 3.0 | 0.0 |
| $WO_3$ | 9.8 | 11.1 | 11.4 | 10.9 | 10.6 | 10.5 | 0.0 |
| Other component | — | — | — | — | — | — | — |
| Total | 100.0 | 100.0 | 100.0 | 100.0 | 100.0 | 100.0 | 100.0 |
| Content of alkali metal oxide (mol %) | 5.2 | 4.8 | 3.7 | 4.7 | 4.3 | 5.7 | 5.5 |

TABLE 1-continued

| | | | | | | | |
|---|---|---|---|---|---|---|---|
| Content of alkali metal oxide (mass %) | 0.8 | 0.8 | 0.6 | 0.8 | 0.7 | 0.7 | 0.9 |
| $n_d$ | 2.01 | 2.00 | 1.99 | 1.96 | 1.95 | 2.05 | 1.97 |
| $T_g$ (° C.) | 476 | 483 | 479 | 474 | 468 | 463 | 480 |
| $\alpha_{50-300}$ ($10^{-7}$/K) | 77 | 73 | 72 | 72 | 75 | 84 | 73 |

TABLE 2

| | Example | | | | | | | |
|---|---|---|---|---|---|---|---|---|
| | 8 mol % | 9 mol % | 10 mol % | 11 mol % | 12 mol % | 13 mol % | 14 mol % | 15 mol % |
| $P_2O_5$ | 27.7 | 25.8 | 24.3 | 21.9 | 20.0 | 21.1 | 19.3 | 25.0 |
| $Bi_2O_3$ | 16.4 | 16.8 | 15.3 | 14.3 | 23.0 | 15.1 | 22.3 | 6.4 |
| $Nb_2O_5$ | 17.4 | 17.9 | 16.2 | 15.2 | 11.2 | 16.0 | 10.8 | 17.3 |
| ZnO | 22.7 | 23.3 | 26.7 | 19.9 | 25.1 | 21.0 | 24.3 | 22.6 |
| $B_2O_3$ | 0.0 | 0.0 | 2.8 | 14.9 | 11.7 | 10.9 | 11.3 | 13.0 |
| $Li_2O$ | 5.5 | 5.7 | 5.1 | 4.8 | 0.0 | 0.0 | 0.0 | 5.5 |
| $Na_2O$ | 0.0 | 0.0 | 0.0 | 0.0 | 0.0 | 6.4 | 0.0 | 0.0 |
| $K_2O$ | 0.0 | 0.0 | 0.0 | 0.0 | 0.0 | 0.0 | 3.3 | 0.0 |
| $TiO_2$ | 0.0 | 0.0 | 0.0 | 0.0 | 0.0 | 0.0 | 0.0 | 0.0 |
| $WO_3$ | 10.3 | 10.5 | 9.4 | 9.0 | 9.0 | 9.5 | 8.7 | 10.2 |
| Other component | — | — | $Sb_2O_3$: 0.2 | — | — | — | — | — |
| Total | 100.0 | 100.0 | 100.0 | 100.0 | 100.0 | 100.0 | 100.0 | 100.0 |
| | mass % | mass % | mass % | mass % | mass % | mass % | mass % | mass % |
| $P_2O_5$ | 19.1 | 17.7 | 17.5 | 16.6 | 13.2 | 15.5 | 13.0 | 21.6 |
| $Bi_2O_3$ | 37.1 | 37.7 | 36.3 | 35.6 | 49.9 | 36.4 | 49.2 | 18.2 |
| $Nb_2O_5$ | 22.4 | 23.0 | 21.9 | 21.6 | 13.9 | 22.0 | 13.6 | 28.1 |
| ZnO | 9.0 | 9.1 | 11.1 | 8.7 | 9.5 | 8.8 | 9.4 | 11.2 |
| $B_2O_3$ | 0.0 | 0.0 | 1.0 | 5.5 | 3.8 | 3.9 | 3.7 | 5.5 |
| $Li_2O$ | 0.8 | 0.8 | 0.8 | 0.8 | 0.0 | 0.0 | 0.0 | 1.0 |
| $Na_2O$ | 0.0 | 0.0 | 0.0 | 0.0 | 0.0 | 2.0 | 0.0 | 0.0 |
| $K_2O$ | 0.0 | 0.0 | 0.0 | 0.0 | 0.0 | 0.0 | 1.5 | 0.0 |
| $TiO_2$ | 0.0 | 0.0 | 0.0 | 0.0 | 0.0 | 0.0 | 0.0 | 0.0 |
| $WO_3$ | 11.6 | 11.7 | 11.1 | 11.2 | 9.7 | 11.4 | 9.6 | 14.4 |
| Other component | — | — | $Sb_2O_3$: 0.3 | — | — | — | — | — |
| Total | 100.0 | 100.0 | 100.0 | 100.0 | 100.0 | 100.0 | 100.0 | 100.0 |
| Content of alkali metal oxide (mol %) | 6.4 | 5.7 | 5.1 | 4.8 | 0 | 6.4 | 3.3 | 5.5 |
| Content of alkali metal oxide (mass %) | 0.8 | 0.8 | 0.8 | 0.8 | 0.0 | 2.0 | 1.5 | 1.0 |
| $n_d$ | 1.99 | 2.01 | 1.99 | 1.96 | 2.00 | 1.97 | 1.99 | 1.89 |
| $T_g$ (° C.) | 485 | 486 | 475 | 485 | 487 | 482 | 480 | 490 |
| $\alpha_{50-300}$ ($10^{-7}$/K) | 80 | 79 | 70 | 69 | 80 | 78 | 85 | 61 |

TABLE 3

| | Example | | | | | | |
|---|---|---|---|---|---|---|---|
| | 16 mol % | 17 mol % | 18 mol % | 19 mol % | 20 mol % | 21 mol % | 22 mol % |
| $P_2O_5$ | 21.7 | 20.4 | 21.7 | 21.0 | 21.0 | 21.0 | 21.0 |
| $Bi_2O_3$ | 22.2 | 13.3 | 14.2 | 13.7 | 13.7 | 13.7 | 13.7 |
| $Nb_2O_5$ | 6.4 | 14.2 | 15.0 | 14.5 | 14.5 | 14.5 | 14.5 |
| ZnO | 27.2 | 18.5 | 19.6 | 19.0 | 19.0 | 19.0 | 19.0 |
| $B_2O_3$ | 12.7 | 10.6 | 11.3 | 10.9 | 10.9 | 10.9 | 10.9 |
| $Li_2O$ | 0.0 | 4.5 | 4.8 | 4.6 | 4.6 | 4.6 | 4.6 |
| $Na_2O$ | 0.0 | 0.0 | 0.0 | 0.0 | 0.0 | 0.0 | 0.0 |

TABLE 3-continued

|  |  |  |  |  |  |  |  |
|---|---|---|---|---|---|---|---|
| $K_2O$ | 0.0 | 0.0 | 0.0 | 0.0 | 0.0 | 0.0 | 0.0 |
| $TiO_2$ | 0.0 | 0.0 | 0.0 | 0.0 | 0.0 | 0.0 | 0.0 |
| $WO_3$ | 9.8 | 18.5 | 8.9 | 8.6 | 8.6 | 8.6 | 8.6 |
| Other component | — | — | $GeO_2$: 4.5 | MgO: 7.7 | CaO: 7.7 | SrO: 7.7 | BaO: 7.7 |
| Total | 100.0 | 100.0 | 100.0 | 100.0 | 100.0 | 100.0 | 100.0 |
|  | mass % | mass % | mass % | mass % | mass % | mass % | mass % |
| $P_2O_5$ | 15.0 | 14.8 | 16.4 | 16.7 | 16.7 | 16.4 | 16.3 |
| $Bi_2O_3$ | 50.5 | 31.7 | 35.3 | 35.8 | 35.7 | 35.2 | 34.8 |
| $Nb_2O_5$ | 8.3 | 19.3 | 21.3 | 21.6 | 21.5 | 21.3 | 21.0 |
| ZnO | 10.8 | 7.7 | 8.5 | 8.7 | 8.6 | 8.5 | 8.4 |
| $B_2O_3$ | 4.3 | 3.8 | 4.2 | 4.2 | 4.2 | 4.2 | 4.1 |
| $Li_2O$ | 0.0 | 0.7 | 0.8 | 0.8 | 0.8 | 0.8 | 0.7 |
| $Na_2O$ | 0.0 | 0.0 | 0.0 | 0.0 | 0.0 | 0.0 | 0.0 |
| $K_2O$ | 0.0 | 0.0 | 0.0 | 0.0 | 0.0 | 0.0 | 0.0 |
| $TiO_2$ | 0.0 | 0.0 | 0.0 | 0.0 | 0.0 | 0.0 | 0.0 |
| $WO_3$ | 11.1 | 22.0 | 11.0 | 11.2 | 11.1 | 11.0 | 10.9 |
| Other component | — | — | $GeO_2$: 2.5 | MgO: 1.0 | CaO: 1.4 | SrO: 2.6 | BaO: 3.8 |
| Total | 100.0 | 100.0 | 100.0 | 100.0 | 100.0 | 100.0 | 100.0 |
| Content of alkali metal oxide (mol %) | 0 | 4.5 | 4.8 | 4.6 | 4.6 | 4.6 | 4.6 |
| Content of alkali metal oxide (mass %) | 0.0 | 0.7 | 0.8 | 0.8 | 0.8 | 0.8 | 0.7 |
| $n_d$ | 1.98 | 1.98 | 1.95 | 1.95 | 1.95 | 1.95 | 1.95 |
| $T_g$ (° C.) | 483 | 478 | 477 | 483 | 482 | 483 | 484 |
| $\alpha_{50-300}$ ($10^{-7}$/K) | 82 | 72 | 73 | 77 | 81 | 81 | 84 |

A flake-shaped glass having each composition shown in Examples 2 and 3 was prepared by weighing, mixing and melting in the same manners as above, pouring the melt in a space of twin rolls, and rapidly cooling the same. Each flake was dry-ground with an alumina-made ball mill for 1 hour to obtain each glass frit. The mass average particle diameter of each glass frit was about 3 microns. 75 g of each glass frit obtained was kneaded with 25 g of an organic vehicle (obtained by dissolving 10 mass % of ethyl cellulose in α-terpineol) to prepare a glass paste. The glass paste was uniformly printed on a soda lime glass having a 10 cm square and a thickness of 0.55 mm, having the surface coated with a silica film at the center thereof in a size of 9 cm square such that the film thickness after firing becomes 30 μm. The film was dried at 150° C. for 30 minutes, the temperature was once returned to room temperature, the temperature was elevated to 450° C. over 30 minutes, the temperature (450° C.) was maintained for 30 minutes, the temperature was elevated to 550° C. over 12 minutes, the temperature (550° C.) was maintained for 30 minutes, and the temperature was decreased to room temperature over 3 hours. Thus, a glass fit fired layer was formed on the soda lime glass substrate. Each soda lime glass substrate with the glass frit fired layer was observed as to whether breakage was generated in the fired layer and the substrate. Furthermore, an average value of warpage of the substrate at four corners of the fired layer was measured. The results are shown in Table 4. The thermal expansion coefficient of 50 to 300° C. ($\alpha_{50-300}$) of the soda lime glass used is $83 \times 10^{-7}$/K.

TABLE 4

| Composition of glass frit | Example 2 | Example 3 |
|---|---|---|
| Breakage of fired layer | None | None |
| Breakage of substrate | None | None |
| Average value of warpage of substrate in four corners of fired layer | 0.00 mm (Acceptable) | 0.00 mm (Acceptable) |

As is clear from the above, it is seen that because the glass for a scattering layer of the organic LED element of the present invention has good adhesion to a substrate, and does not cause the problems of warpage, breakage and the like, the glass is suitable as a scattering layer of an organic LED element.

Confirmation test of improvement in light extraction efficiency is described below.

Soda lime glass manufactured by Asahi Glass Co., Ltd. was used as a glass substrate. The scattering layer was prepared as follows. Powder raw materials were prepared so as to have a glass composition shown in Table 5.

TABLE 5

|  | Mol % | Mass % |
|---|---|---|
| $P_2O_5$ | 22.7 | 16.8 |
| $Bi_2O_3$ | 14.9 | 36.3 |
| $Nb_2O_5$ | 15.7 | 21.8 |
| ZnO | 20.6 | 8.7 |
| $B_2O_3$ | 11.8 | 4.3 |
| $Li_2O$ | 5.0 | 0.8 |
| $WO_3$ | 9.3 | 11.3 |

The powder material prepared was melted in an electric furnace at 1,050° C. for 90 minutes, and maintained at 950° C. for 60 minutes. The resulting melt was cast on a roll to obtain flakes of a glass. The glass has a glass transition temperature of 475° C., a yield point of 525° C. and a coefficient of thermal expansion of 72×10⁻⁷ (1/° C.) (average value of 50 to 300° C.). The measurement was conducted by a thermal expansion method with a thermal analyzer (trade name: TD5000SA, manufactured by Bruker) in a temperature rising rate of 5° C./min. The refractive index nF in F-ray (486.13 nm) is 2.00, the refractive index nd in d-ray (587.56 nm) is 1.98, and the refractive index nC in C-ray (656.27 nm) is 1.97. The measurement was conducted with a refractometer (trade name: KPR-2000, manufactured by Kalnew Optical Industrial Company, Limited).

The flake prepared was ground with a zirconia-made planetary mill for 2 hours, and sieved to obtain a glass powder. The particle size distribution in this case was that D50 is 2.15 µm, D10 is 0.50 µm and D90 is 9.72 µm. 35 g of the glass powder obtained was kneaded with 13.1 g of an organic vehicle (obtained by dissolving ethyl cellulose in α-terpineol or the like) to prepare a glass paste. The glass paste was uniformly printed on the above-described glass substrate in a circle having a diameter of 10 mm such that the film thickness after firing is 14 µm. The film was dried at 150° C. for 30 minutes. The temperature was once returned to room temperature, elevated to 450° C. over 45 minutes, and maintained at 450° C. for 30 minutes, thereby firing the film. The temperature was elevated to 580° C. over 13 minutes, maintained at 580° C. for 30 minutes, and then decreased to room temperature over 3 hours. Thus, a scattering layer was formed on the glass substrate.

To evaluate characteristics of the scattering layer-attached substrate thus prepared, haze and surface waviness were measured.

In the haze measurement, a haze computer (trade name: HZ-2) manufactured by Suga test Instruments Co., Ltd. was used, and a glass substrate single body was used as a standard sample. That is, it is constituted such that when the glass substrate single body is measured, the total light transmittance is 100, and the haze is 0. As a result of the measurement, the total light transmittance was 79, and the haze value was 52.

The surface waviness was measured. The apparatus used was a surface roughness measuring instrument (trade name: SURFCORDER ET4000A) manufactured by Kosaka Laboratory Ltd. The roughness measurement was conducted with an evaluation length of 5.0 mm and a cutoff wavelength of 2.5 mm in a measurement rate of 0.1 mm/s. As a result, the arithmetic average roughness Ra was 0.55 µm, and the arithmetic average wavelength λa was 193 µm. Those numerical values are according to ISO 4287-1997 standard.

Figure 3:
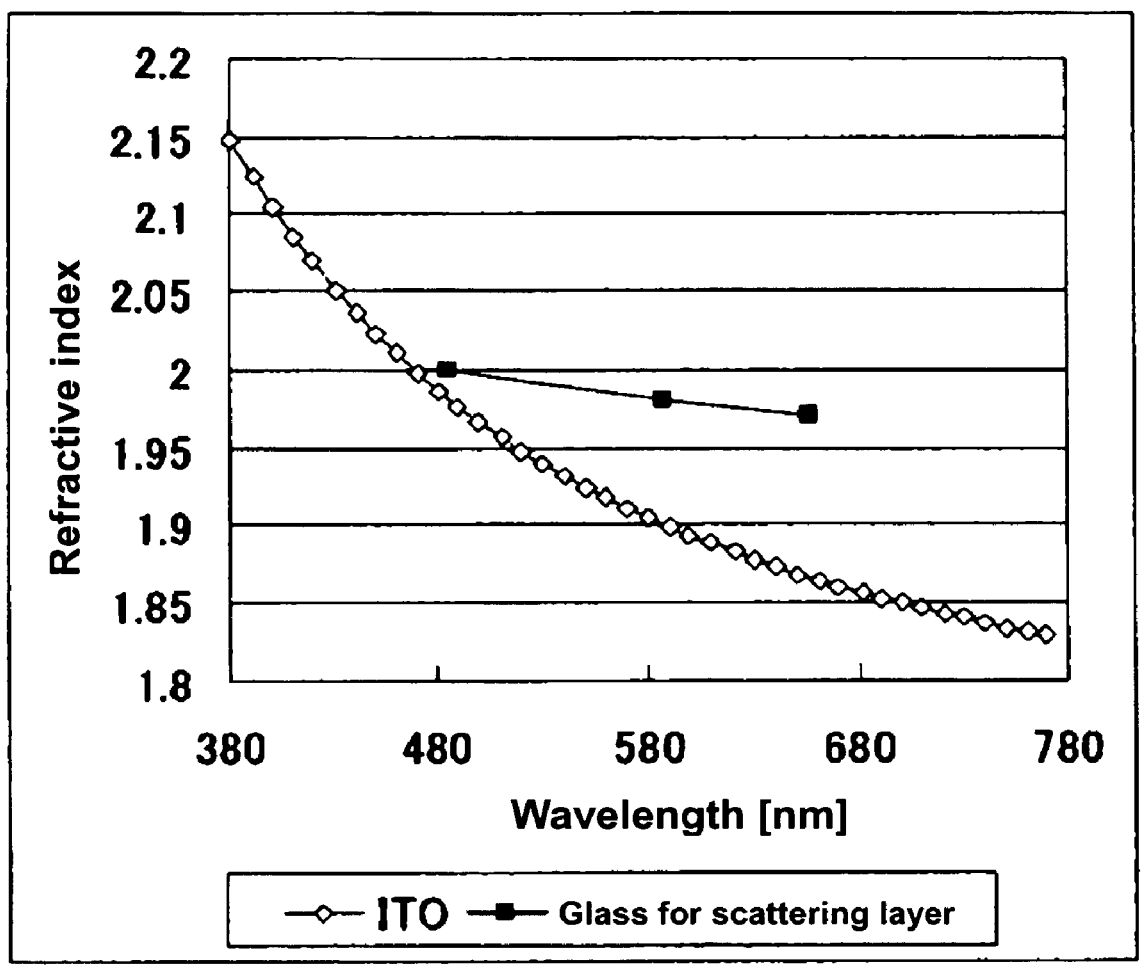
FIG. 3 is a graph showing the relationship between a refractive index of ITO and a refractive index of a glass for a scattering layer.

The above-described scattering layer-attached glass substrate and a scattering layer-free substrate were provided to prepare organic EL elements. ITO was film-formed as a translucent electrode in a thickness of 150 nm with DC magnetron sputter. In the sputtering, the translucent electrode is film-formed into the desired shape using a mask. The refractive index of ITO and the refractive index of the glass for a scattering layer are shown in FIG. 3. In FIG. 3, the vertical axis indicates a refractive index and the horizontal axis indicates a wavelength (unit: nm). The substrate was subjected to ultrasonic cleaning using pure water and IPA, and then irradiated with ultraviolet ray using an excimer UV generator, thereby cleaning the surface. Using a vacuum depositor, α-NPD(N, N'-diphenyl-N,N'-bis(1-napththyl)-1,1'-biphenyl-4,4'-diamine: CAS No. 123847-85-4) was film-formed in a thickness of 100 nm, Alq3(tris-8-hydroxyquinoline aluminum: CAS No. 2085-33-8) was film-formed in a thickness of 60 nm, LiF was film-formed in a thickness of 0.5 nm, and Al was film-formed in a thickness of 80 nm. In this case, α-NPD and Alq3 were formed into a circular pattern having a diameter of 12 mm using a mask, and LiF and Al were formed into a pattern using a mask that has a region of 2 mm square on the ITO pattern through the organic film. Thus, an element substrate was completed.

A glass substrate (PD200 manufactured by Asahi Glass Co., Ltd.) separately prepared was subjected to sandblast treatment to partially form depressions. Thus, a counter electrode was prepared. Photosensitive epoxy resin was applied to the bank of the periphery of the depressions as for peripheral sealing.

The element substrate and the counter substrate were placed in a groove box having nitrogen atmosphere, and a rehydration material containing CaO was adhered to the depressions of the counter substrate. The element substrate and the counter substrate were then bonded, and the resulting laminate was irradiated with ultraviolet ray to cure the resin for peripheral sealing. Thus, an organic EL element was completed.

Figure 4:
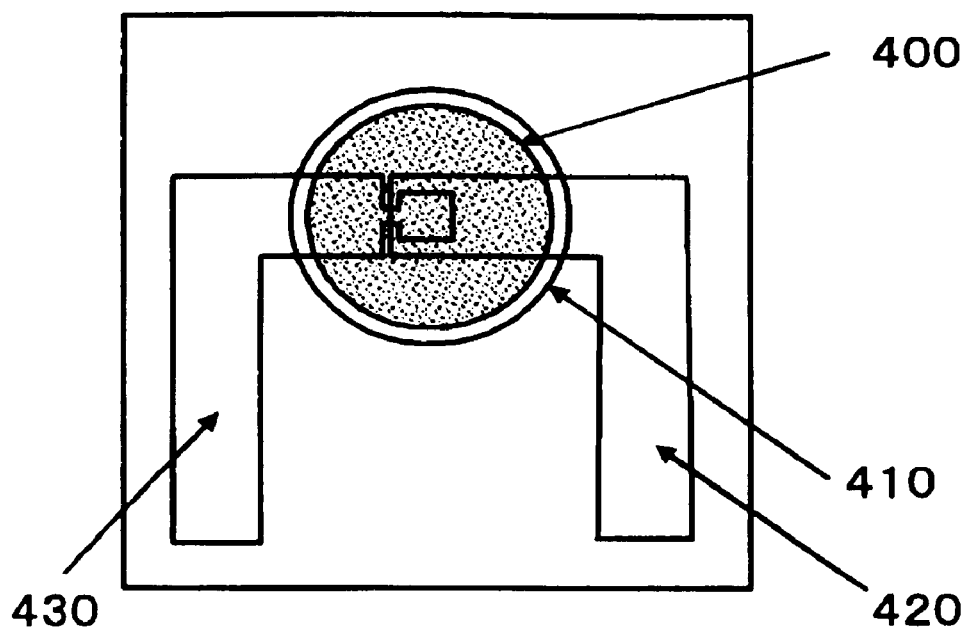
FIG. 4 is a top view showing the constitution of an element having a scattering layer.
Figure 5:
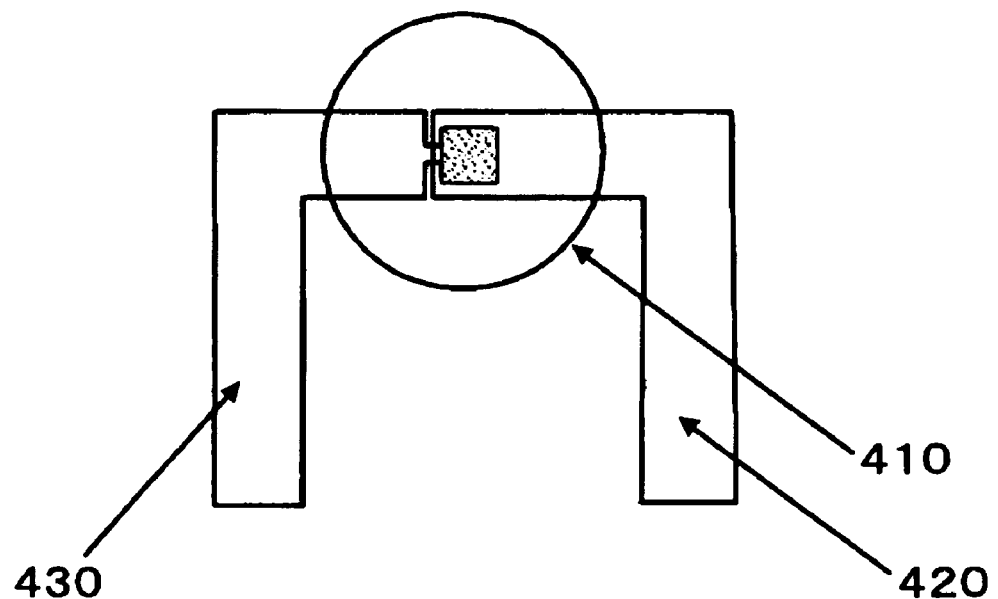
FIG. 5 is a top view showing the constitution of an element free of a scattering layer.

The state that the element light-emits is shown in FIG. 4 and FIG. 5. FIG. 4 shows the element having a scattering layer, and FIG. 5 sows the element free of a scattering layer. In those drawings, 400 indicates a scattering layer, 410 indicates an organic layer, 420 indicates ITO pattern, and 430 indicates Al pattern. In the element free of a scattering layer, light emission is confirmed in only the region having about 2 mm square formed by intersecting the ITO pattern and the Al pattern. On the other hand, in the element formed on the scattering layer, it is seen that light is extracted into the atmosphere from not only the about 2 mm square region but the peripheral scattering layer-formed portions.

Optical characteristics of the element were measured.

Figure 6:
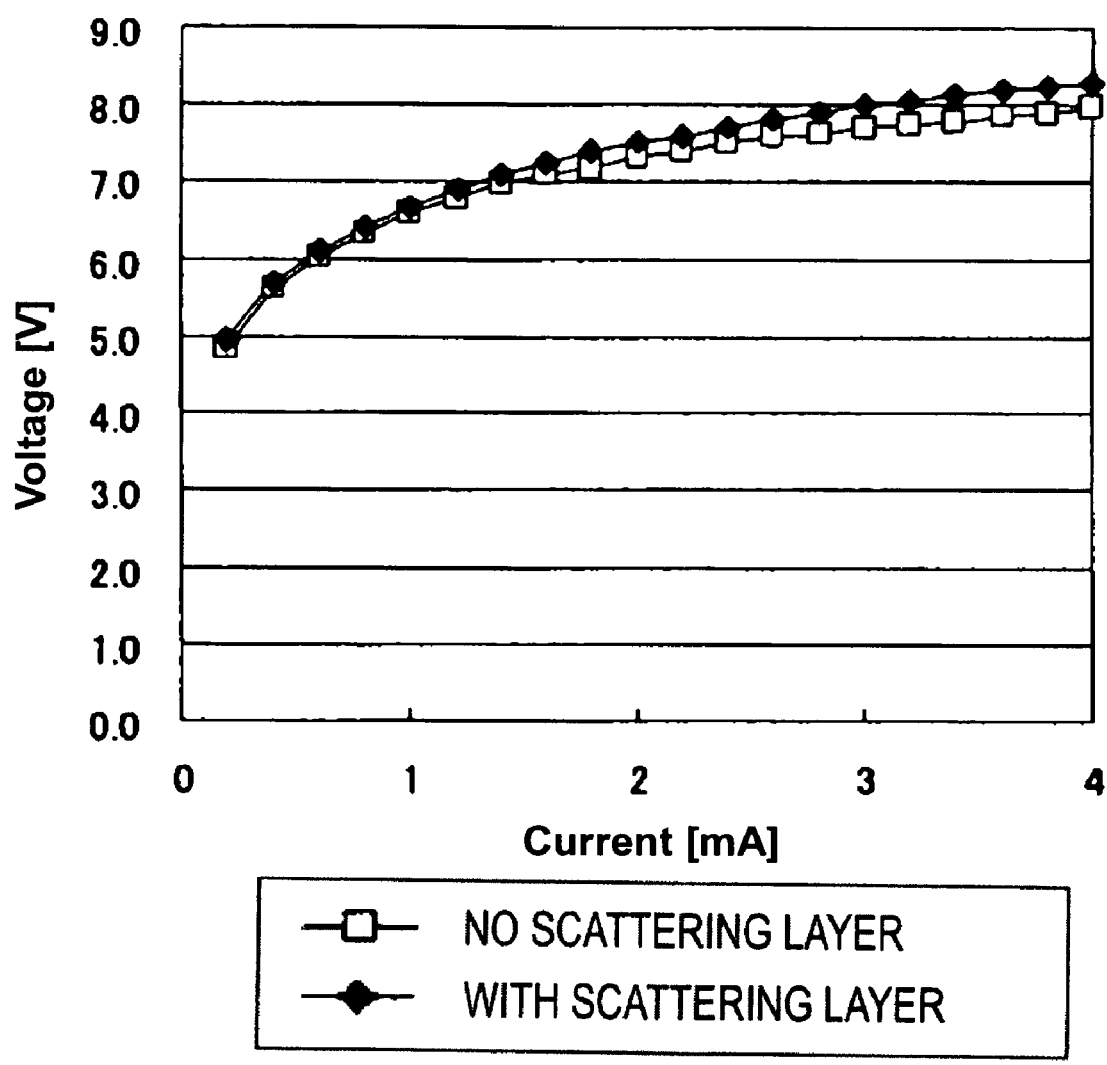
FIG. 6 is a graph showing the relationship between voltage and current.
Figure 7:
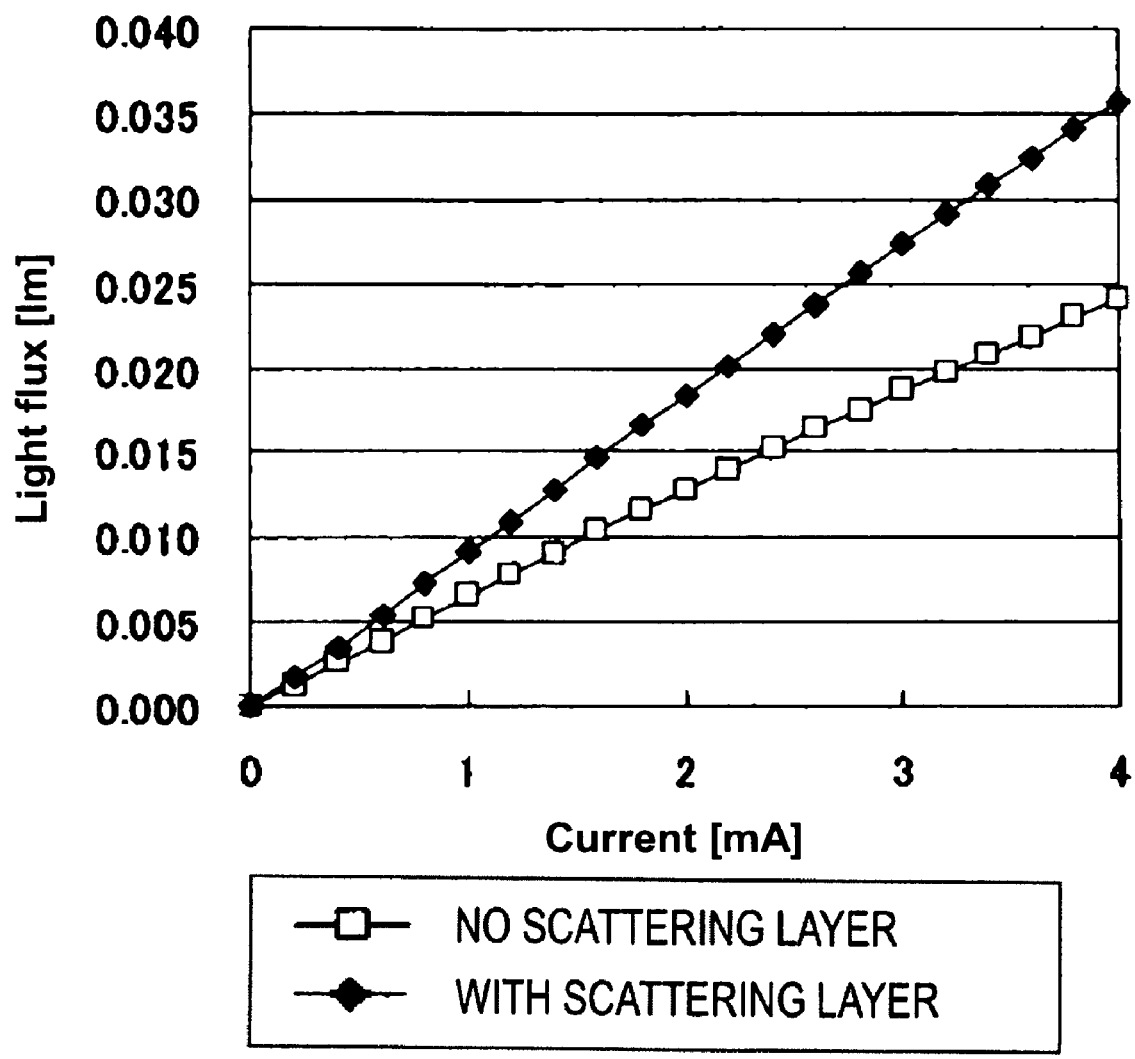
FIG. 7 is a graph showing the relationship between light flux and current.

EL characteristic measuring instrument C9920-12 manufactured by Hamamatsu Photonics K.K. was used for the measurement of the total light flux. Current-voltage characteristics in the element having a scattering layer and the element free of a scattering layer are shown in FIG. 6. In FIG. 6, the vertical axis indicates voltage (unit: V) and the horizontal axis indicates current (unit: mA). Thus, the characteristics in nearly the same level are obtained, and it is seen that large leak current is not present even in the element formed on the scattering layer. Current light flux characteristics are shown in FIG. 7. In FIG. 7, the vertical axis indicates light flux (unit: lm) and the horizontal axis indicates current (unit: mA). Thus, regardless of the presence or absence of a scattering layer, the light flux amount is in proportion to current. It could be confirmed that the light flux amount of the element having a scattering layer is increased 51%, as compared with the element free of a scattering layer. This indicates that because the refractive index of the scattering layer is higher than the refractive index of ITO which is a translucent electrode in the light emission wavelength (470 nm to 700 nm) of Alq3 as shown in FIG. 3, EL emitted light of Alq3 is suppressed from the total reflection at the interface between ITO and the scattering layer, and light is efficiently extracted to the atmosphere.

Figure 8:
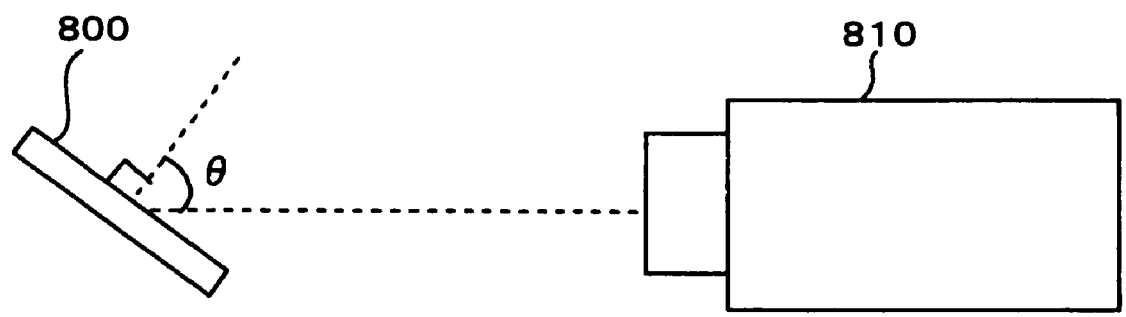
FIG. 8 is a conceptual view of a system evaluating angular dependency of light emission.
Figure 9:
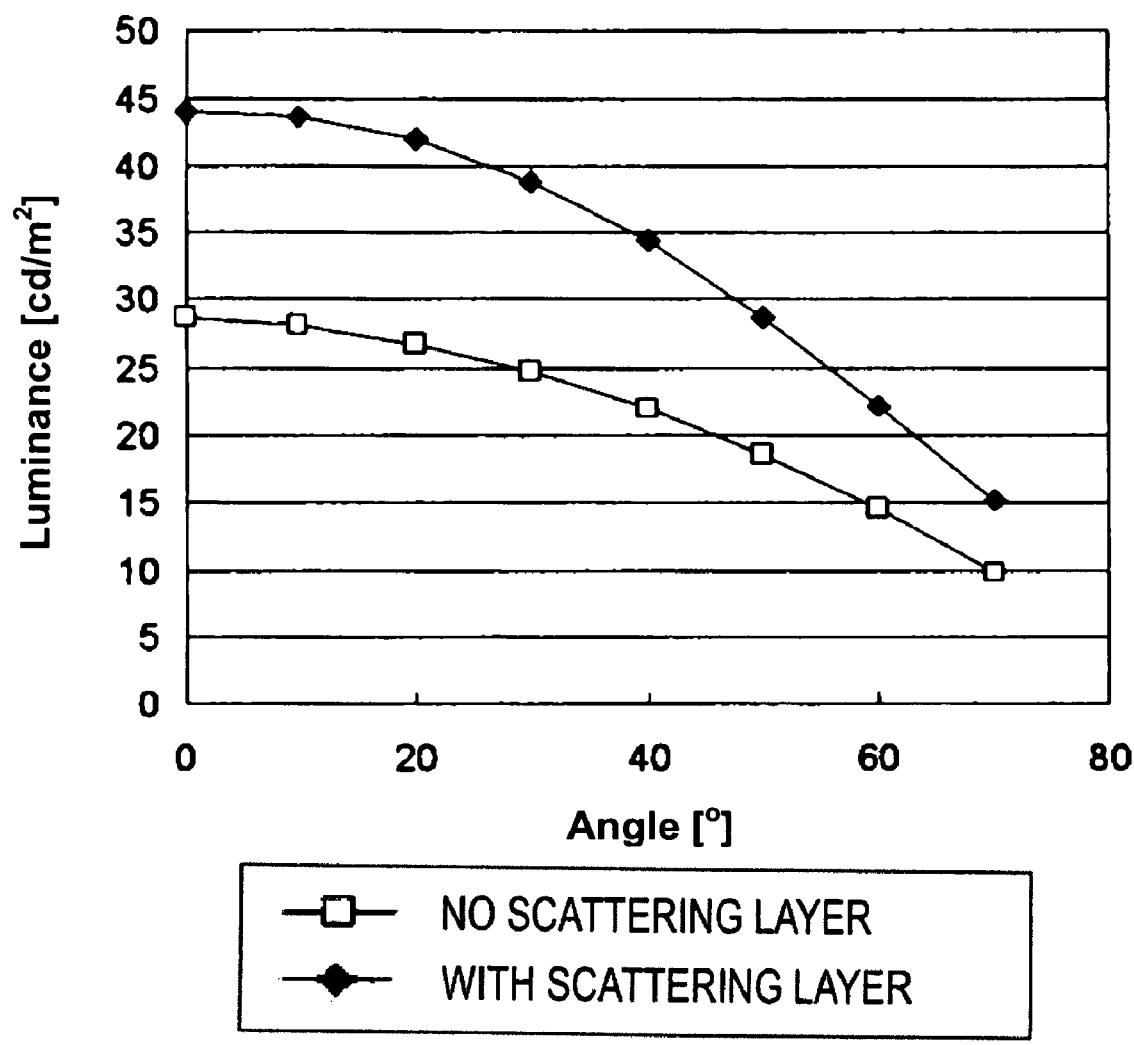
FIG. 9 is a graph showing the relationship between luminance and angle.
Figure 10:
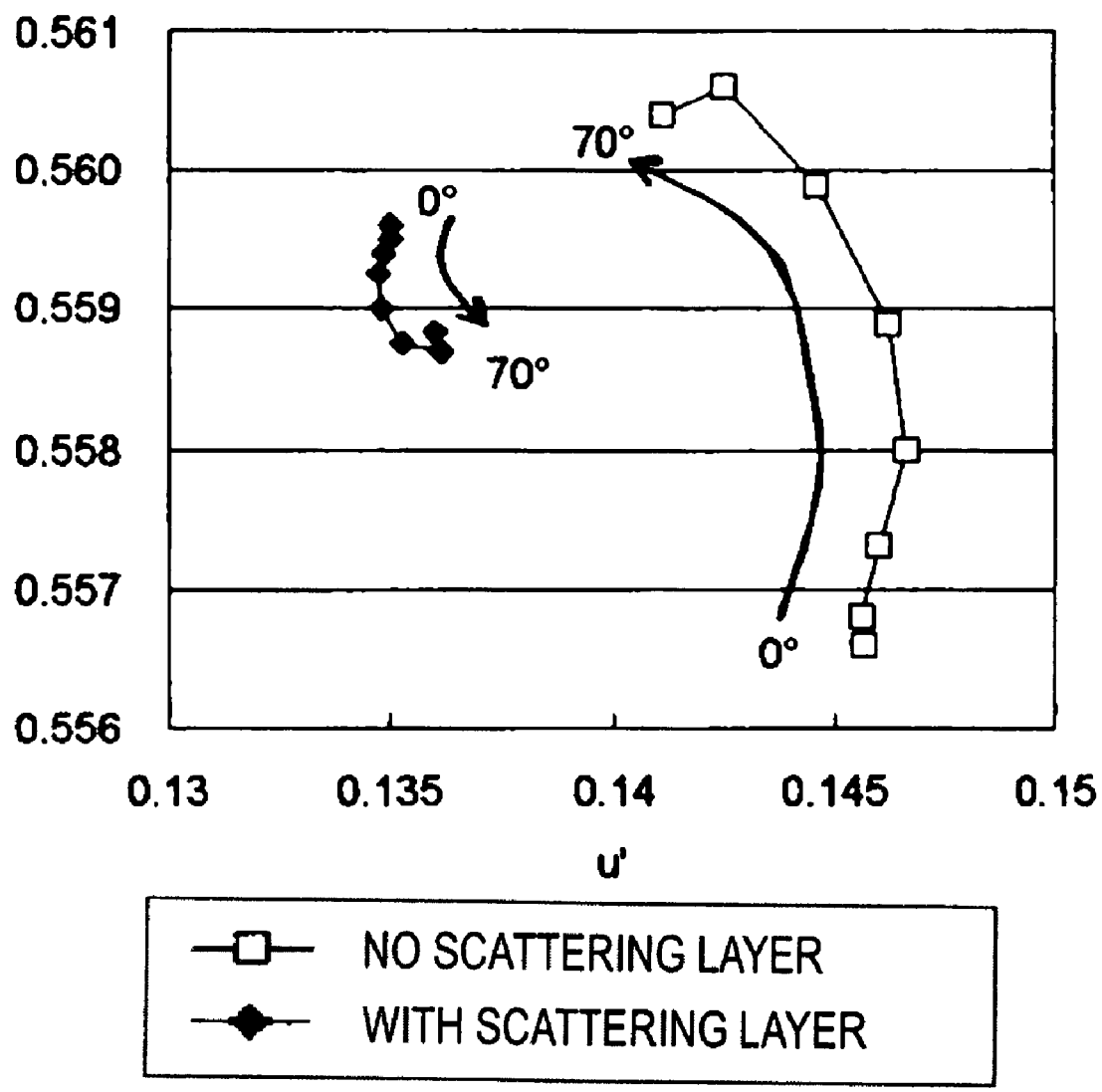
FIG. 10 is a graph showing the relationship between chromaticity and angle.

Angular dependency of light emission was evaluated. Color luminance meter (trade name: BM-7A) manufactured by Topcon Technohouse Corporation was used for the measurement, and light emission luminance and angular dependency of emitted light color were measured by conducting the measurement while rotating the element to the luminance meter as shown in FIG. 8. In FIG. 8, 800 indicates an evaluation element, and 810 indicates a spectroscope. When measured, 1 mA current is applied to the element to light up. The definition of angle was that an angle between a normal direction of the element and a direction toward the luminance meter from the element is a measurement angle θ [°]. That is, the state that the luminance meter is arranged on the front of the element is 0°. Luminance data obtained from the measurement are shown in FIG. 9. In FIG. 9, the vertical axis indicates luminance (unit: cd/m$^2$) and the horizontal axis indicates an angle (unit: °). Chromaticity data obtained from the measurement are shown in FIG. 10. In FIG. 10, the vertical axis indicates V' and the horizontal axis indicates U'. CIE 1976 UCS color system is used for the calculation of chromaticity coordinate.

It is seen from the luminance data of FIG. 9 that the case having a scattering layer indicates high luminance in any measurement angle as compared with the case free of a scattering layer. Furthermore, when the total light flux is calculated by integrating those luminance data in each solid angle, it could be confirmed that the case having a scattering layer increases light flux amount by 54% as compared with the case free of a scattering layer. This is nearly equivalent to the measurement result in the total light flux measuring instrument described above, and indicates that the light flux amount of the element is greatly improved by the scattering layer.

It is seen from the chromaticity data of FIG. 10 that in the element free of a scattering layer, chromaticity is greatly changed by the measurement angle, whereas in the element having a scattering layer, the change is decreased. It was seen from those results that by imparting a scattering layer to the element, other than the effect of improving the light extraction efficiency which is the original object, additional effect of relaxing angle change of color is obtained. That the angle change of color is small brings about a large merit in a light-emitting element that a viewing angle is not limited.

This application is based on Japanese Patent Application No. 2009-014332 filed on Jan. 26, 2009, the disclosure of which is incorporated herein by reference in its entity.

DESCRIPTION OF THE REFERENCE NUMERALS AND SIGNS

| | |
|---|---|
| 110: | Translucent substrate |
| 120: | Scattering layer |
| 130: | First electrode |
| 140: | Organic layer |
| 150, 210: | Second electrode |

The invention claimed is:

1. A glass for a scattering layer of an organic LED element, comprising, in terms of mol % on the basis of oxides:
   15 to 30% of $P_2O_5$,
   5 to 25% of $Bi_2O_3$,
   5 to 27% of $Nb_2O_5$, and
   10 to 35% of ZnO,
and having a total content of alkali metal oxides comprising $Li_2O$, $Na_2O$ and $K_2O$ of 5% by mass or less.

2. The glass for a scattering layer of an organic LED element according to claim 1, wherein the total content of the alkali metal oxides is 2% by mass or less.

3. The glass for a scattering layer of an organic LED element according to claim 1, which does not substantially contain the alkali metal oxides.

4. The glass for a scattering layer of an organic LED element according to claim 1, which does not substantially contain $TiO_2$.

5. The glass for a scattering layer of an organic LED element according to claim 1, which does not substantially contain lead oxide.

6. An organic LED element comprising a transparent substrate, a first electrode provided on the transparent electrode, an organic layer provided on the first electrode, and a second electrode provided on the organic layer,
   wherein the organic LED element further comprises a scattering layer comprising, in terms of mol % on the basis of oxides, 15 to 30% of $P_2O_5$, 5 to 25% of $Bi_2O_3$, 5 to 27% of $Nb_2O_5$ and 10 to 35% of ZnO and having a total content of alkali metal oxides comprising $Li_2O$, $Na_2O$ and $K_2O$ of 5% by mass or less.

7. The organic LED element according to claim 6, wherein the scattering layer is provided on the transparent substrate.

8. The organic LED element according to claim 6, wherein the scattering layer is provided on the organic layer.

9. The organic LED element according to claim 6, wherein the first and second electrodes are a transparent electrode.

10. The organic LED element according to claim 6, which is used in illumination.

* * * * *